United States Patent
Ahn

[19]

[11] Patent Number: 6,143,124
[45] Date of Patent: *Nov. 7, 2000

[54] APPARATUS AND METHOD FOR GENERATING A PLASMA FROM AN ELECTROMAGNETIC FIELD HAVING A LISSAJOUS PATTERN

[75] Inventor: Kie Y. Ahn, Chappaqua, N.Y.

[73] Assignee: Micron Technology, Inc., Boise, Id.

[ * ] Notice: This patent issued on a continued prosecution application filed under 37 CFR 1.53(d), and is subject to the twenty year patent term provisions of 35 U.S.C. 154(a)(2).

[21] Appl. No.: 08/917,017

[22] Filed: Aug. 22, 1997

[51] Int. Cl.$^7$ ............................................. C23F 1/02
[52] U.S. Cl. .................... 156/345; 118/723 ER; 118/723 IR; 118/623; 204/298.16; 204/298.06
[58] Field of Search ............... 118/723 E, 723 I, 118/723 ER, 723 IR, 623; 204/298.06, 298.16; 156/345 MG, 345 C; 315/111.21, 111.51

[56] References Cited

U.S. PATENT DOCUMENTS

| | | | |
|---|---|---|---|
| 3,442,758 | 5/1969 | Penfold et al. | 376/123 |
| 4,887,005 | 12/1989 | Rough et al. | 315/111.21 |
| 5,039,388 | 8/1991 | Miyashita et al. | 204/192.32 |
| 5,146,137 | 9/1992 | Gesche et al. | 315/111.51 |
| 5,215,619 | 6/1993 | Cheng et al. | 156/345 |
| 5,280,154 | 1/1994 | Cuomo et al. | 219/121.52 |
| 5,345,145 | 9/1994 | Harafuji et al. | 315/111.21 |
| 5,404,079 | 4/1995 | Ohkuni et al. | 315/111.21 |
| 5,405,448 | 4/1995 | Jost et al. | 118/723 E |
| 5,543,688 | 8/1996 | Morita | 315/111.21 |
| 5,554,223 | 9/1996 | Imahashi | 315/111.51 |
| 5,565,074 | 10/1996 | Qian et al. | 204/208.08 |
| 5,753,066 | 5/1998 | Kubota et al. | 204/298.06 |

OTHER PUBLICATIONS

Noboru Nomura et al., Lissajous Electron Plasma (LEP) Generation for Dry Etching, Jpn. J. Appl. Phys. vol. 31 (Dec. 1992) Pt. 1, No. 12B, pp. 4332–4337.

S. M. Rossnagel et al., Metal Ion Deposition from Ionized Mangetron Sputtering Discharge, J. Vac. Sci Technol. B 12(1) Jan./Feb. 1994, pp. 449–453.

*Primary Examiner*—Maria Nuzzolillo
*Assistant Examiner*—Julian A. Mercado
*Attorney, Agent, or Firm*—Kirkpatrick & Lockhart LLP

[57] ABSTRACT

An apparatus for forming an electromagnetic field in a processing chamber, including a first pair of electrodes for generating a first electromagnetic field within the processing chamber and a second pair of electrodes for generating a second electromagnetic field within the processing chamber. The first and second pairs of electrodes are oriented so that the first and second electromagnetic fields are oriented generally perpendicular to each other. When energized, the first and second electromagnetic fields combine and may take the form of a lissajous pattern. When a gas is exposed to the combined electromagnetic field a plasma may be formed in the general shape of the combined electromagnetic field.

27 Claims, 7 Drawing Sheets

APPARATUS AND METHOD FOR GENERATING A PLASMA FROM AN ELECTROMAGNETIC FIELD HAVING A LISSAJOUS PATTERN

CROSS-REFERENCE TO RELATED APPLICATION

Not applicable.

STATEMENT REGARDING FEDERALLY-SPONSORED RESEARCH OR DEVELOPMENT

Not applicable.

BACKGROUND OF THE INVENTION

1. Field of the Invention

The present invention is directed generally to an apparatus and method for using perpendicular electromagnetic fields to produce a plasma and, more particularly, to an apparatus and method for using perpendicular electromagnetic fields forming a lissajous pattern to produce a plasma in a semiconductor processing chamber.

2. Description of the Background

Plasma enhanced processing is well known in the art of semiconductor fabrication. In plasma enhanced processing, a radio frequency electromagnetic field is used to form a plasma within a processing chamber. A plasma is a gas in which electrons have been stripped from their normal orbits around atomic nuclei, so that the electrons easily pass from one atomic nuclei to another. A plasma is formed when a gas is subjected to an intense electromagnetic field or is heated to extremely high temperatures. The plasma can have different effects, such as ionizing particles or creating chemically active species from chemically inactive species within the processing chamber. Plasma enhanced processing is used with various semiconductor fabrication methods, including etching, sputtering, and chemical vapor deposition. Typically, an intense, radio frequency electromagnetic field is used to generate a torroid-shaped plasma within a processing chamber. It is known to generate the intense electromagnetic fields with either a field coil or with electrodes.

One example of a plasma enhanced processing system using a field coil and sputter deposition is described in a paper by S. M. Rossnagel and J. Hopwood entitled *Metal Ion Deposition From Ionizing Magnetron Sputtering Discharge,* J. Vac. Sci. Technol. B 12(1) 449, January/February 1994. That paper describes an apparatus using plasma enhanced processing to ionize sputtered particles and then to accelerate those particles towards a semiconductor wafer to reduce shadowing during sputter deposition. Ionization of the sputtered particles is accomplished by generating a dense, inductively-coupled radio frequency (RFI) plasma in the processing chamber between a sputter target and the wafer. The RFI plasma is generated with a coil located within the processing chamber between the target and the wafer. The coil generates a radio frequency electromagnetic field which, in turn, generates the plasma from gasses present in the vacuum chamber. The sputtered particles are ionized as they pass through the plasma on their way to the wafer.

Once ionized, the sputtered particles are accelerated towards the wafer with the aid of a bias voltage applied to the wafer. The bias voltage is opposite in polarity to the charge induced on the sputtered particles to attract the sputtered particles to the wafer. The density and uniformity of the plasma depends on the density and uniformity of the electromagnetic field generated by the coil. The desired result is to create a plasma that is both dense and uniform so that sputtered particles are uniformly ionized when they pass through it.

The coil typically has between two and three turns, and the precise shape and length of the coil affects the phase, shape, and strength of the electromagnetic field generated by the coil, and thereby affects the shape and density of the plasma. For example, as mentioned in the Rossnagel et al. reference at page 450, the symmetry of the coil is extremely important when a system having a rotating coil is used. If the coil in such a system is not precisely symmetrical, the moving magnetic field will weakly couple into the RFI plasma and cause variations of the magnetic rotation rate.

Another example of plasma enhanced processing system using a field coil is disclosed in U.S. Pat. No. 5,280,154, issued to Cuomo et al. That design, like the one disclosed in the Rossnagel et al. paper, requires that the coil be precisely shaped for a uniform electromagnetic field to be generated.

It is also known to construct plasma enhanced processing systems that use electrodes to generate an electromagnetic field. Those systems function similarly to the inductively-coupled system described by Rossnagel et al., except that the plasma is generated by electrodes instead of a coil. U.S. Pat. No. 4,887,005, issued to Rough, discloses a three electrode system using two energized electrodes separated by a ground electrode. U.S. Pat. No. 5,543,688, issued to Morita, discloses a system having several parallel electrodes wherein every other electrode is energized and the remaining electrodes are grounded. A plasma is formed between the parallel electrodes and gases introduced into the processing chamber flow between the electrodes and are ionized in the plasma. U.S. Pat. No. 5,039,388, issued to Mayashita et al., discloses a system whereby an energized electrode is provided at the top of a processing chamber and a wafer support forms a ground electrode.

An article by Noboru Nomura et al., entitled *Lissajous Electron Plasma (LEP) Generation for Dry Etching* and published beginning on page 4332 of the December 1992 issue of the *Japanese Journal of Applied Physics,* discloses using electrodes to generate a lissajous electron plasma within a processing chamber. That design orients three electrodes with a triangular symmetry around a processing chamber, with a fourth electrode below the others and in the center of the chamber. The reference discloses in §4, on page 4336, that:

> Theoretically, when the phase shift between electrodes is 0° or 120°, a symmetric configuration is realized, resulting in a uniform plasma. On the other hand, when the phase shift is set at other values, the voltage drop between electrodes is different [from] one another resulting in a non-uniform plasma.

Apparently, the device disclosed in the Nomura et al. reference is limited to use with phase shifts between the electrodes of 0° and 120°. That portion of the reference also implies that the voltage drop between the electrodes must be identical. In addition, the device appears to require that the frequencies of the electrodes are equal. See page 4332, column 2, lines 2–3. As will be described in more detail hereinbelow, varying the phase shift, amplitude, and frequency allows a lissajous pattern to be varied. The apparent inability of the device described in the Nomura et al. reference to operate when those parameters are varied seems to prevent it from varying the lissajous pattern. The device described in the Nomura et al. reference appears to limited to generating lissajous patterns having a generally triangular shape (when viewed from above), or perhaps a generally circular shape (when viewed from above). See, for example, the first paragraph in §3 and FIGS. 3(a) and 3(b), both on page 4334. See also, page 4336, second column, lines 3–7. As a result, the device described in the Nomura et al. reference appears to be limited to generating circular-shaped and triangular-shaped electromagnetic fields and, therefore, it has limited applications.

In summary, many prior art plasma generation systems are inadequate for large semiconductor wafers currently being developed. In particular, as wafers approach 30 centimeters in diameter, many prior art systems fail to provide uniform electromagnetic fields across the entire wafer, resulting in non-uniform plasmas, non-uniform deposition on the wafers, and, ultimately, reduced yield. Other prior art systems designed to be used with large wafers appear to have narrow operating parameters and produce only a limited range of plasma shapes. Those systems, therefore, have limited applications.

Thus, the need exists for an apparatus for generating a uniform electromagnetic field over a large area, and for generating the electromagnetic field, and thereby a plasma, in a variety of shapes.

BRIEF SUMMARY OF THE INVENTION

The present invention is directed to an apparatus for forming an electromagnetic field in a processing chamber. The apparatus includes a first pair of electrodes for generating a first electromagnetic field within the processing chamber and a second pair of electrodes for generating a second electromagnetic field within the processing chamber. The first and second pairs of electrodes are oriented so that the first and second electromagnetic fields are generally perpendicular to each other.

The present invention also includes a system for processing semiconductor wafers. The system includes a processing chamber, a first pair of electrodes, a second pair of electrodes, a power supply, a wafer holder, a sealable door, and an apparatus for introducing a gas into the processing chamber. The power supply is connected to the first and second pairs of electrodes. The first pair of electrodes generates a first electromagnetic field and the second pair of electrodes generates a second electromagnetic field. The first and second electrodes are oriented so that the first and second electromagnetic fields are generally perpendicular to each other.

Furthermore, the present invention includes a method for generating an electromagnetic field having a lissajous pattern, including the steps of generating a first electromagnetic field and generating a second electromagnetic field that is generally perpendicular to the first electromagnetic field to form a combined electromagnetic field having a lissajous pattern.

The present invention solves problems inherent in the prior art by providing a simple design that generates a uniform and dense electromagnetic field, resulting in a uniform and dense plasma suitable for use with large semiconductor wafers. Those and other advantages and benefits of the present invention will become apparent from the description of the preferred embodiments hereinbelow.

BRIEF DESCRIPTION OF THE SEVERAL VIEWS OF THE DRAWINGS

For the present invention to be clearly understood and readily practiced, the present invention will be described in conjunction with the following figures, wherein.

DETAILED DESCRIPTION OF THE INVENTION

It is to be understood that the figures and descriptions of the present invention have been simplified to illustrate elements that are relevant for a clear understanding of the present invention, while eliminating, for purposes of clarity, many other elements found in a typical plasma enhanced processing chamber and in a plasma enhanced processing system. Those of ordinary skill in the art will recognize that other elements are desirable and/or required to implement the present invention. However, because such elements are well known in the art, and because they do not facilitate a better understanding of the present invention, a discussion of such elements is not provided herein.

Figure 1:
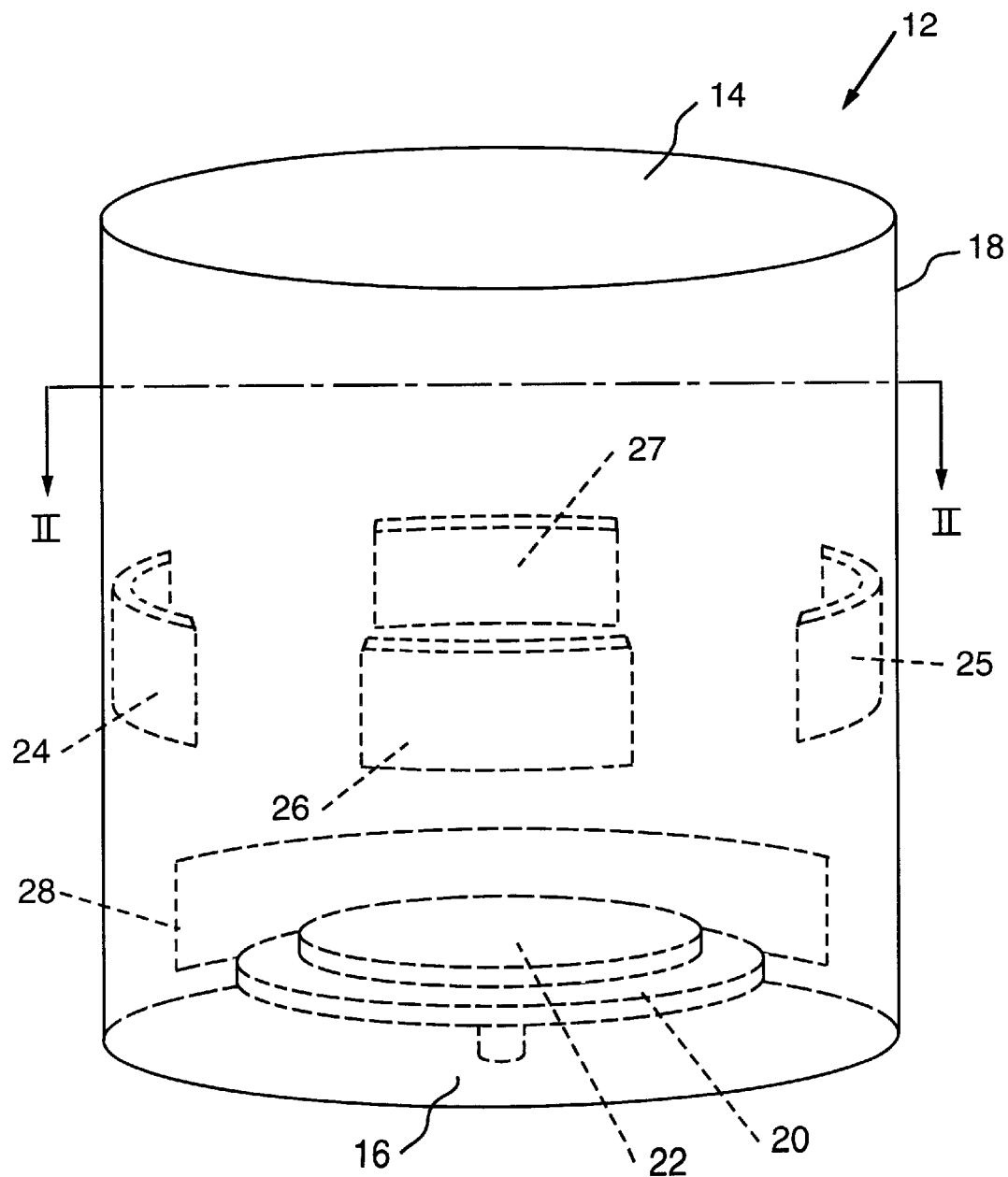
FIG. 1 is an elevational view of a plasma enhanced processing chamber constructed in accordance with the present invention.

FIG. 1 is an elevational view of a plasma enhanced processing chamber 12 constructed in accordance with the present invention. The processing chamber 12 is preferably constructed from aluminum or stainless steel, and has a ceiling 14, a floor 16, and a cylindrical side wall 18. Some of the features within the processing chamber 12 are illustrated with broken lines, including a wafer holder 20 for holding a wafer 22, a first pair of electrodes 24, 25, and a second pair of electrodes 26, 27. The processing chamber 12 also includes a sealable door 28 to allow access to within the processing chamber 12. Although the present invention is described in terms of an apparatus and method for fabricating semiconductor wafers, the present invention is not limited to any particular fabrication technology or substrate material or shape. The term "wafer", as used herein, is intended to include all variations of substrates, including variations in materials, shapes, and fabrication techniques. For example, the processing chamber 12 may be used for fabricating semiconductor wafers using several different fabrication technologies, including silicon-on-insulator (such as silicon-on-sapphire), thin film transistor, and more conventional doped silicon semiconductor substrate technology.

Figure 2:
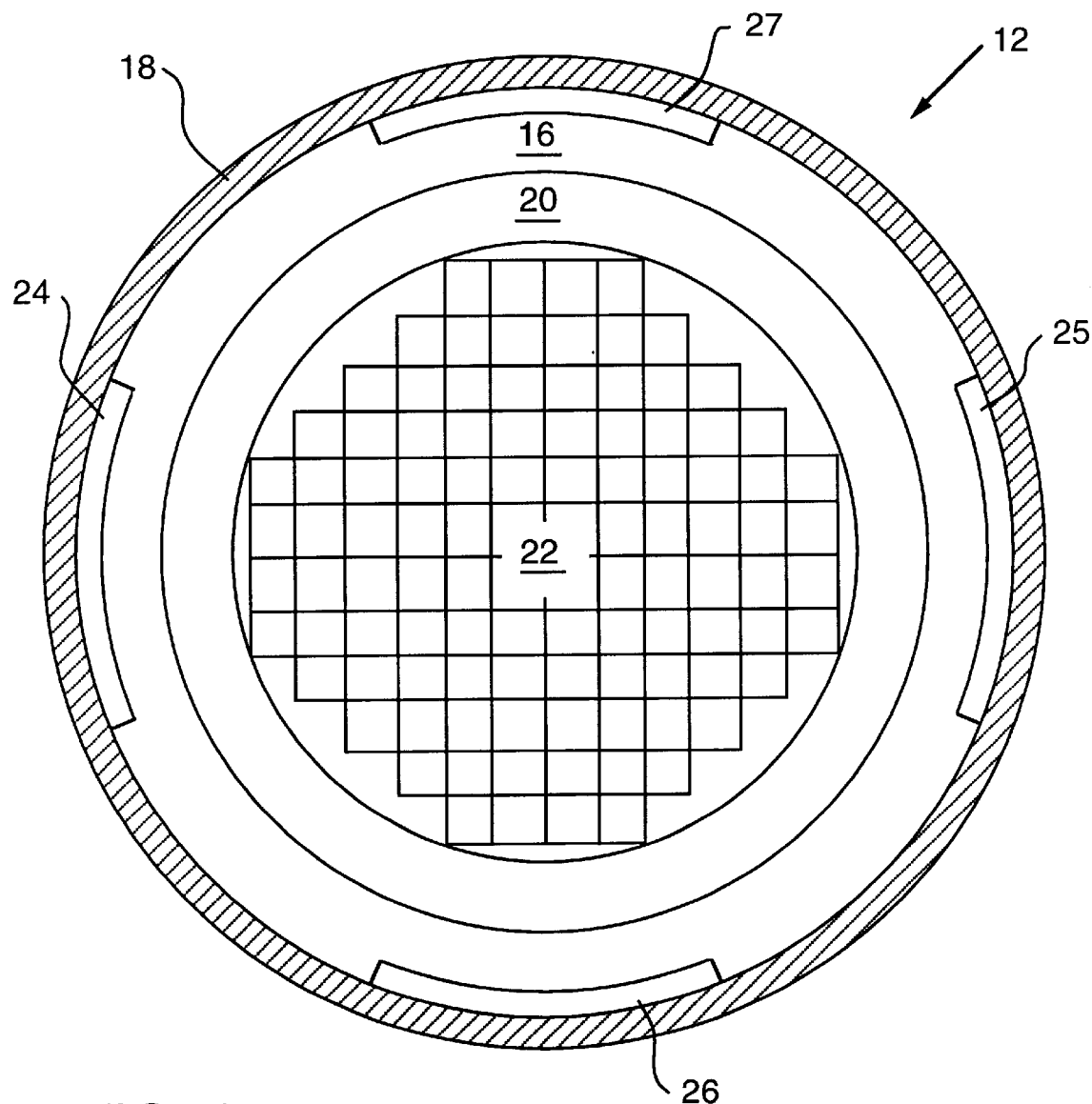
FIG. 2 is a cross-sectional view along line II—II of the processing chamber illustrated in FIG. 1.

FIG. 2 is a cross-sectional view of the processing chamber 12 along line II—II of FIG. 1, illustrating the wafer holder 20, the wafer 22, and the electrodes 24–27. In the preferred embodiment, the electrodes 24–27 are located within the processing chamber 12 and either close to the side wall 18 or attached to the side wall 18. The electrodes 24–27 are approximately equal in size and approximately equally spaced around the side wall 18 so that the first pair of electrodes 24, 25 face each other and are approximately 180 degrees apart. Similarly, the second pair of electrodes 26, 27 face each other and are approximately 180 degrees apart. Each of the electrodes 24–27 in the preferred embodiment, when viewed from above, has a curved shape to conform to the side wall 18 of the processing chamber 12. The electrodes 24–27, however, may also be formed in other shapes, such as flat plates.

Figure 3:
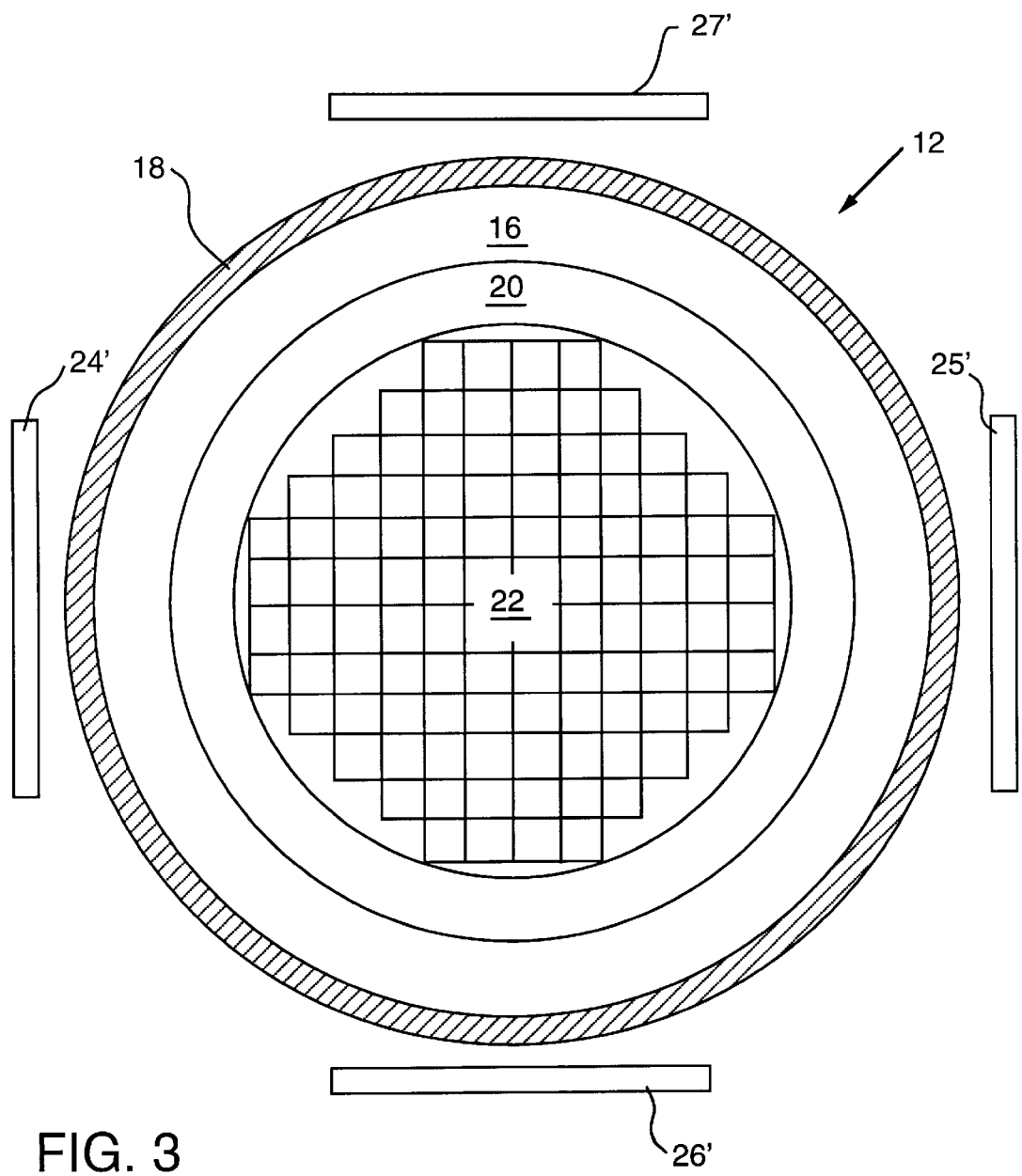
FIG. 3 is a cross-sectional view of a processing chamber illustrating an alternative embodiment of the present invention.

FIG. 3 is a cross-sectional view of a processing chamber illustrating an alternative embodiment of the present invention wherein electrodes 24', 25', 26', 27' are flat and are located outside of the processing chamber 12. Alternatively, the electrodes 24'–27' may be formed in other shapes, such as curved like the electrodes 24–27 illustrated in FIG. 2. Locating the electrodes 24'–27' outside of the processing chamber 12 offers an advantage over the embodiment illustrated in FIG.2 because it eliminates the need to periodically clean the electrodes 24'–27' of contaminants that build up inside a processing chamber during the normal course of fabricating semiconductors. The processing chamber 12 is constructed from a material, such as glass, that will allow electromagnetic fields to pass from the electrodes 24'–27' into the processing chamber 12.

Figure 4:
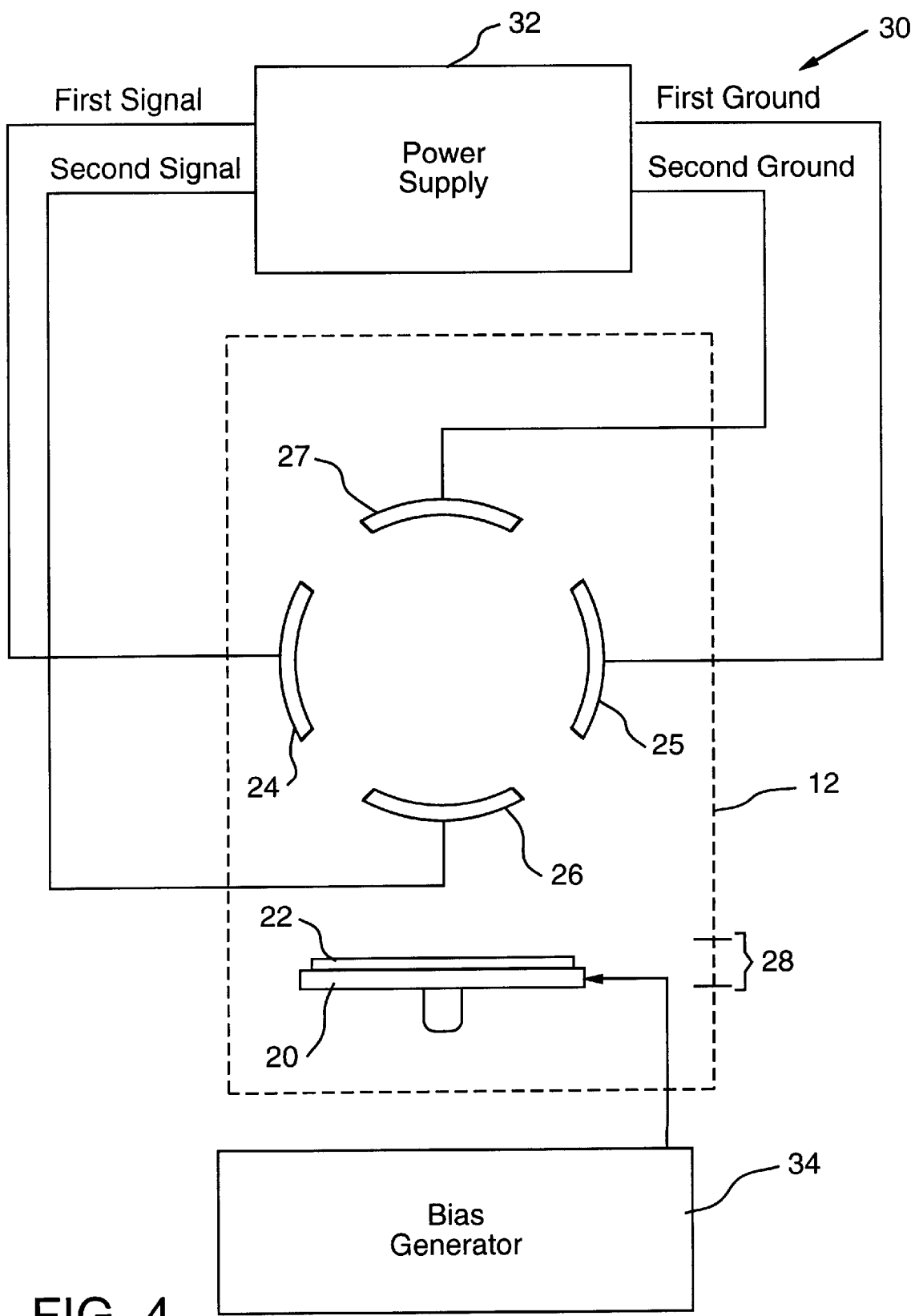
FIG. 4 is a schematic diagram illustrating a plasma enhanced processing system constructed in accordance with the present invention.

FIG. 4 is a schematic diagram illustrating a plasma enhanced processing system 30 constructed in accordance with the present invention. The system 30 includes the processing chamber 12 housing the wafer holder 20 and the electrodes 24–27. The system 30 also includes a power supply 32 for generating a first signal and a first ground for the first pair of electrodes 24, 25, and a second signal and a second ground for the second pair of electrodes 26, 27. In an alternative embodiment, a single ground may be shared by both electrodes 25, 27. The first and second signals drive electrodes 24, 26, respectively, to generate first and second electromagnetic fields within the processing chamber 12. The system 30 also includes a bias generator 34 for providing a bias voltage to the wafer holder 20 to accelerate ionized particles and gases towards the wafer 22. Additional details regarding the power supply 32 and the bias generator 34 are provided below.

An electromagnetic field can take the form of a lissajous pattern if two mutually-perpendicular, harmonic, electromagnetic fields are combined. As a result of the orientation of the electrodes 24–27 in the present invention, an electromagnetic field generated by the first pair of electrodes 24, 25 will be approximately perpendicular to an electromagnetic field generated by the second pair of electrodes 26, 27, making it possible to generate an electromagnetic field having a lissajous pattern. There are an infinite number of lissajous patterns that can be formed by combining two mutually-perpendicular, harmonic signals. For example, when two mutually--perpendicular signals are equal in amplitude and frequency but are out of phase with each other by ninety degrees, a circular lissajous pattern is formed. When one signal has twice the frequency of the other, a figure eight pattern is formed. If the amplitude of the signals forming the lissajous pattern are not equal, the resulting pattern will be distorted with respect to a pattern formed from signals having equal amplitudes. Superior results should be realized with the present invention when an electromagnetic field having a lissajous pattern is used to generate the plasma because the shape of the electromagnetic field and the shape of the resulting plasma are substantially the same. The present invention should generate a uniform and dense plasma suitable for use with large semiconductor wafers 22 on a size of the order of thirty centimeters or more.

In the preferred embodiment, the power supply 32 generates first and second signals that have approximately equal amplitudes and frequencies but which are out of phase with each other by approximately ninety degrees. The result, when viewed from above in the processing chamber 12, is an electromagnetic field having a circular lissajous pattern to conform to the circular cross-sectional shape of the processing chamber 12. The resulting plasma, when viewed from above in the processing chamber 12, should also be approximately circular in shape and should generally conform to the cross-sectional shape of the processing chamber 12. The design of the present invention also allows for the generation of electromagnetic fields, and thereby plasmas, having other lissajous patterns. Those other lissajous patterns can be made to conform to desired shapes. For example, when using a processing chamber 12 having an oblong or generally rectangular cross-sectional shape, the frequency of the first signal may be an integer multiple of the frequency of the second signal so that the electromagnetic field generated, and the resulting plasma, are generally rectangular and conform to the general shape of the processing chamber 12. Alternatively, the amplitudes of the first and second signals may be varied so that they are not equal, thereby forming an electromagnetic field and plasma having a desired shape. Varying the phase of the first and second signals may also be used to modify the shape of a lissajous pattern. The design of the present invention allows varying the amplitudes, frequencies, and phase of the first and second signals, either individually or collectively, to form electromagnetic fields and plasmas having lissajous patterns to suit the needs of various applications.

A plasma enhanced processing system 30 constructed in accordance with the present invention may be operated in the same manner and at the same specifications as prior art plasma enhanced processing systems. In the preferred embodiment, the processing chamber 12 will contain an argon gas at a pressure of between approximately one millitorr and approximately fifty millitorr. The power supply 32 will generate first and second signals having sinusoidal forms with typical frequencies of approximately 13.56 megahertz. At that frequency, the power required from the power supply 32 is expected to be between approximately one kilowatt and approximately two kilowatts for a typical application. The bias generator 34 preferably provides up to approximately 500 volts to the wafer holder 20 and will typically consume up to approximately three kilowatts of power.

Figure 5:
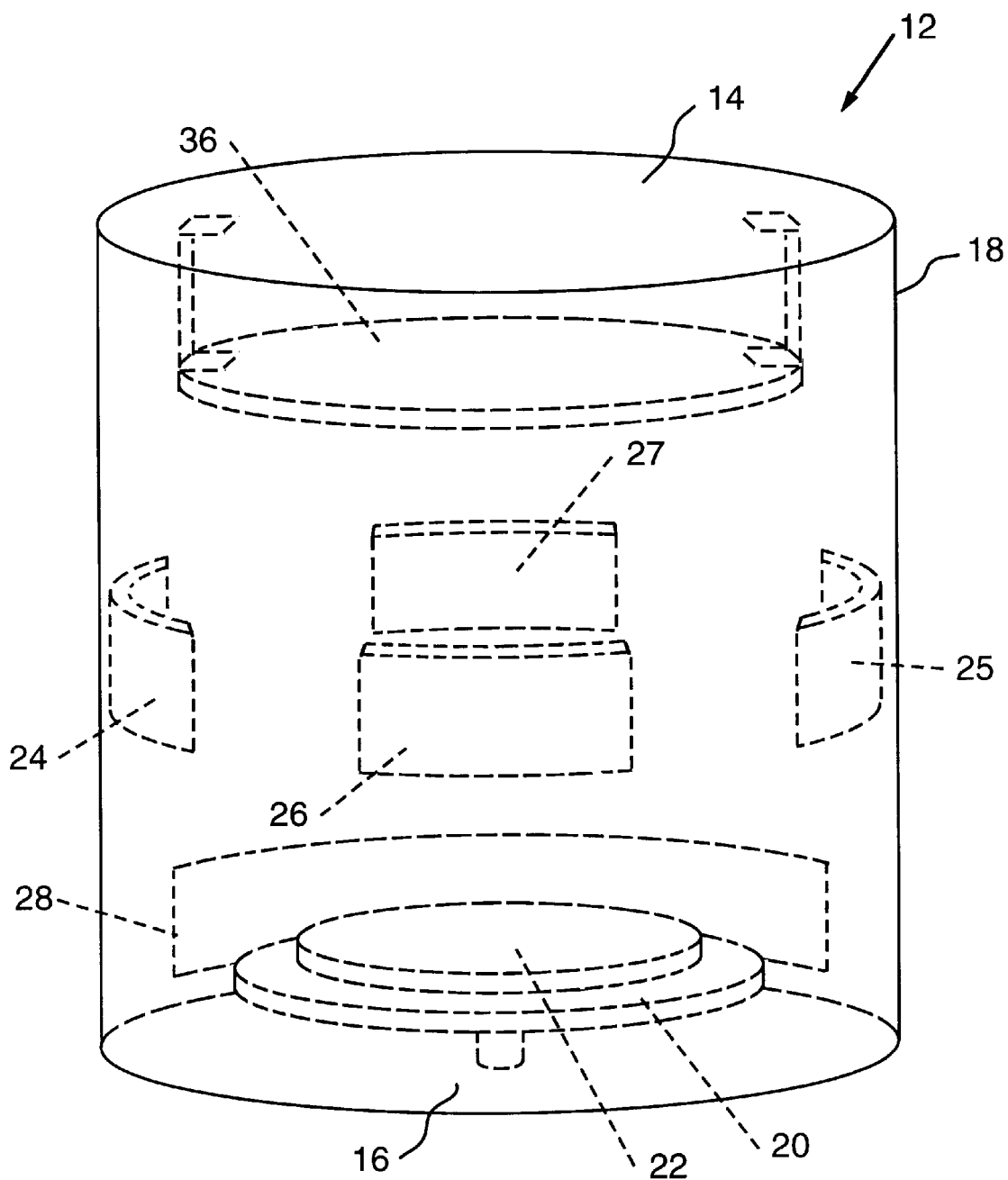
FIG. 5 is an elevational view of a preferred embodiment of the present invention including a sputter target.

Furthermore, the processing chamber 12 preferably includes a source of deposition material. That source serves to introduce deposition materials into the processing chamber 12 for deposition onto the wafer 22. For example, FIG. 5 illustrates a preferred embodiment of the present invention including a sputter target 36 attached to the ceiling 14 of the processing chamber 12 so that materials forming the target 36 may be sputtered and deposited on the wafer 22. A bias voltage relative to the wall 18 and/or the floor 16 of the processing chamber 12 is preferably applied to the sputter target 36. The magnitude of the bias voltage will vary, but typical applications will use a bias voltage between approximately negative two hundred volts and negative six hundred volts. The bias voltage may be provided by the power supply 32, the bias generator 34, or by a separate source (not shown). The bias voltage is expected to consume between approximately ten kilowatts and approximately thirty kilowatts of power in a typical application, depending on, for example, the rate of sputtering. The bias voltage is preferably confined to the sputter target 36, and in the preferred embodiment the sputter target 36 is electrically insulated from the processing chamber 12.

Figure 6:
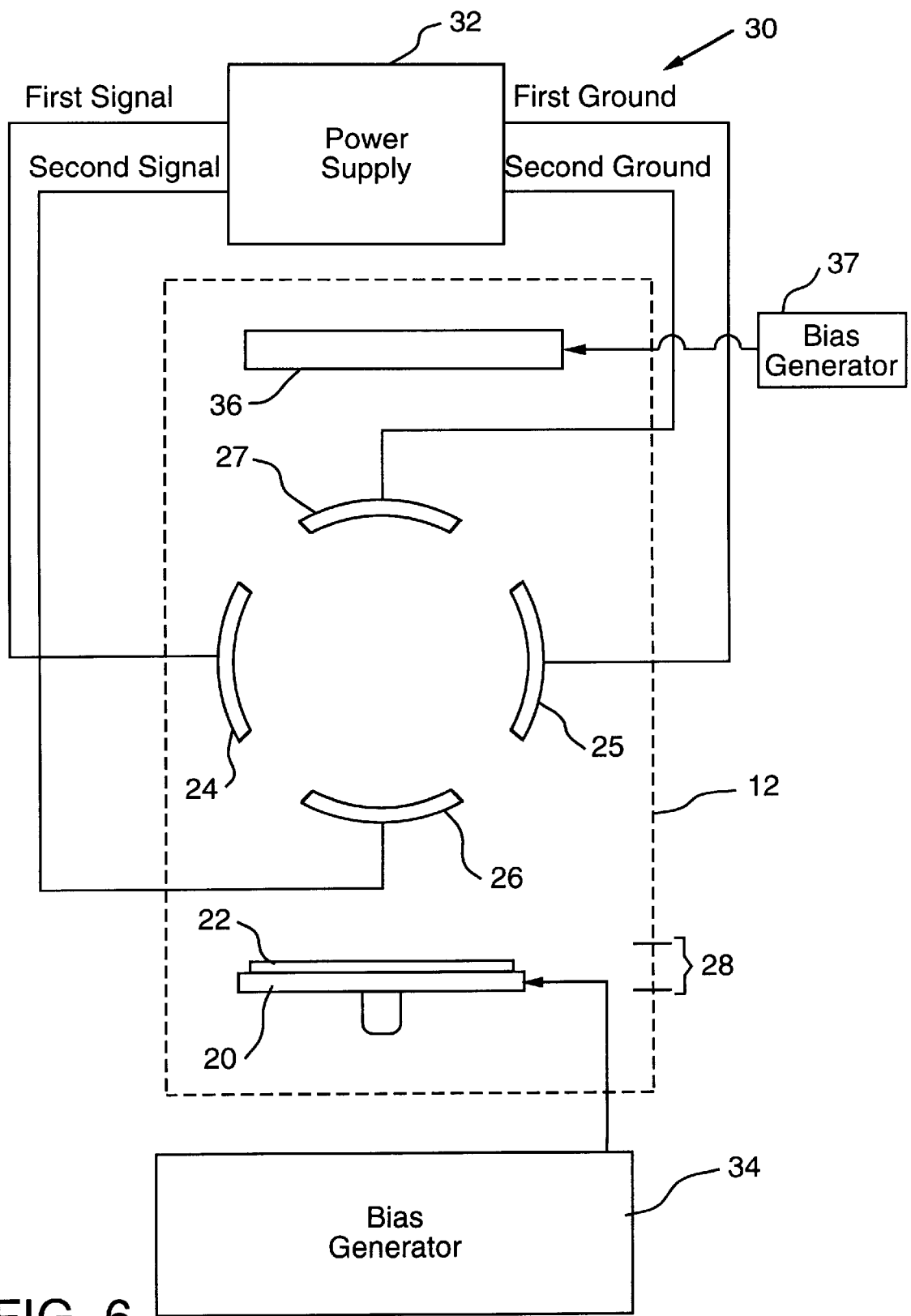
FIG. 6 is a schematic diagram illustrating an alternative embodiment of a plasma enhanced processing system constructed in accordance with the present invention.

FIG. 6 is a schematic diagram illustrating ore embodiment of the plasma enhanced processing system constructed in accordance with the present invention. That embodiment includes a separate bias generator 37 to apply a bias to the sputter target 36. Alternatively, as described hereinabove, a bias may also be applied to the target 36 from the power supply 32 or from the bias generator 34 used to bias the wafer holder 20.

Figure 7:
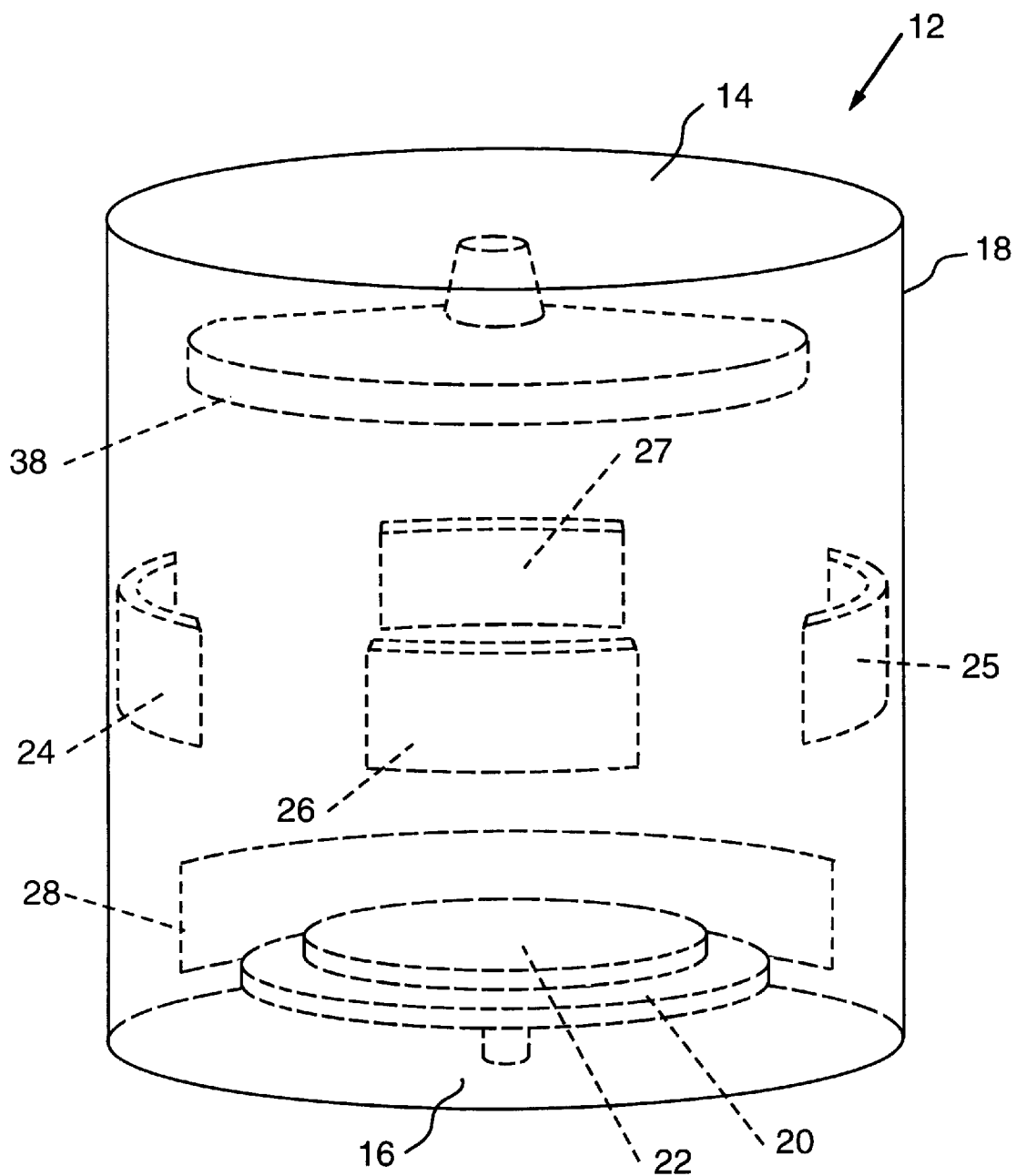
FIG. 7 is an elevational view of an alternative embodiment of the present invention including a gas nozzle.

FIG. 7 illustrates an alternative embodiment of the present invention including a gas nozzle 38 in the form of a showerhead for the introduction of gases to be deposited on the wafer 22, such as during chemical vapor deposition. As with the target 36 described with respect to FIG. 6, a bias may also be applied to the gas nozzle 38. If a bias is applied to the gas nozzle 38, the gas nozzle 38 is preferably insulated from the processing chamber 12 so that the bias is confined to the gas nozzle 38.

Preferably, components such as sputter targets 36 and gas nozzles 38 are located near the ceiling 14 of the processing chamber 12 so that particles or gases introduced into the processing chamber 12 will pass through the plasma generated by the electrodes 24–27 on their way to the wafer 22.

The present invention also includes a method for generating a plasma from a gas in a processing chamber. The method comprises generating first and second electromagnetic fields within the processing chamber 12 so that the electromagnetic fields are generally perpendicular to each other. In the preferred embodiment, an electromagnetic field having a lissajous pattern is formed, for example, from electromagnetic fields having equal amplitudes and frequencies, but ninety degrees out of phase with each other. In addition, as discussed above, other lissajous patterns may be formed by altering the frequencies, amplitudes, and phases of the electromagnetic fields.

Furthermore, the method of the present invention may be used with a plasma enhanced processing system 30 whereby the electromagnetic fields may be driven by electrical signals, such as those discussed above with respect to the power supply 32. Gases and other materials are preferably introduced into the processing chamber 12 and subjected to the plasma generated by the electromagnetic fields before being deposited on the wafer 22 by a number of methods known in the art, such as sputtering a target 36 and introduction of a gas through a nozzle 38.

Those of ordinary skill in the art will recognize that many modifications and variations of the present invention may be implemented. The foregoing description and the following claims are intended to cover all such modifications and variations.

What is claimed is:

1. An apparatus for forming an electromagnetic field in a processing chamber, comprising:

a first pair of electrodes oppositely disposed at opposite sides of the processing chamber;

a second pair of electrodes oppositely disposed at opposite sides of the processing chamber, the first arid second pairs of electrodes being oriented so that a first electromagnetic field generated between the first pair of electrodes and a second electromagnetic field generated between the second pair of electrodes are oriented generally perpendicular to each other; and a power supply connected to said first and second pairs of electrodes, wherein the power supply supplies a first signal having a first amplitude to the first pair of electrodes and a second signal having a second amplitude to the second pair of electrodes, wherein the first amplitude does not equal the second amplitude.

2. The apparatus of claim 1, wherein said first and second pairs of electrodes are within the processing chamber.

3. The apparatus of claim 1, wherein said first and second pairs of electrodes are outside of the processing chamber.

4. The apparatus chamber of claim 1, wherein said first and second pairs of electrodes are generally flat in shape.

5. The apparatus of claim 1, wherein said first and second pairs of electrodes are curved.

6. The apparatus of claim 1 wherein said power supply energizes said first and second pairs of electrodes to form an electromagnetic field having a lissajous pattern.

7. The apparatus of claim 1, wherein the first signal has a first phase and the second signal has a second phase, the first and second phases having a predetermined relationship.

8. The apparatus of claim 7 wherein the predetermined relationship includes the first signal being approximately ninety degrees out of phase with the second signal.

9. The apparatus of claim 1, wherein the first signal has a first frequency and the second signal has a second frequency, the first and second frequencies having a predetermined relationship.

10. The apparatus of claim 9 wherein the predetermined relationship includes the first frequency and the second frequency being approximately equal.

11. The apparatus of claim 9 wherein the predetermined relationship includes the first frequency being approximately an integer multiple of the second frequency.

12. An apparatus for generating an electromagnetic field, comprising:

a processing chamber;

a first pair of electrodes oppositely disposed at opposite sides of said processing chamber;

a second pair of electrodes oppositely disposed at opposite sides of said processing chamber, the first and second pairs of electrodes being oriented so that a first electromagnetic field generated between the first pair of electrodes and a second electromagnetic field generated between the second pair of electrodes are oriented generally perpendicular to each other; and a power supply connected to said first and second pairs of electrodes, wherein the power supply supplies a first signal having a first amplitude to the first pair of electrodes and a second signal having a second amplitude to the second pair of electrodes, wherein the first amplitude does not equal the second amplitude.

13. The apparatus of claim 12, wherein said processing chamber has a generally circular cross-sectional shape.

14. The apparatus of claim 12, wherein said first and second pairs of electrodes are located within said processing chamber.

15. The apparatus of claim 12, wherein said first and second pairs of electrodes are located outside of said processing chamber.

16. A system for processing semiconductor wafers, comprising:

a processing chamber;

a first pair of electrodes oppositely disposed at opposite sides of the processing chamber;

a second pair of electrodes oppositely disposed at opposite sides of the processing chamber, the first and second pairs of electrodes being oriented so that a first electromagnetic field generated between the first pair of electrodes and a second electromagnetic field generated between the second pair of electrodes are oriented generally perpendicular to each other;

a power supply connected to said first and second pairs of electrodes, wherein the power supply supplies a first signal having a first amplitude to the first pair of electrodes and a second signal having a second amplitude to the second pair of electrodes, wherein the first amplitude does not equal the second amplitude;

a wafer holder within said processing chamber;

a sealable door in said processing chamber; and a source of deposition material within said chamber.

17. The system of claim 16, wherein said wafer holder is biased with an electrical potential.

18. The system of claim 16, wherein said source of deposition material includes a sputtering target.

19. The system of claim 16, wherein said source of deposition material includes a shower head.

20. A method for generating an electromagnetic field within a processing chamber, comprising:

energizing a first pair of electrodes with a first energizing signal having a first amplitude, wherein the first pair of electrodes are oppositely disposed at opposite sides of the processing chamber such that the first pair of electrodes produce a first electromagnetic field in the processing chamber; and energizing a second pair of electrodes with a second energizing signal having a second amplitude, wherein the second pair of electrodes are oppositely disposed at opposite sides of the processing chamber such that the second pair of electrodes produce a second electromagnetic field in the processing chamber perpendicular to the first electromagnetic field, and wherein the first amplitude does not equal the second amplitude.

21. The method of claim 20, wherein energizing the second pair of electrodes includes energizing the second pair of electrodes with a second energizing signal having predetermined phase relationship with the first energizing signal.

22. The method of claim 21, wherein energizing the second pair of electrodes includes energizing the second pair of electrodes with a second energizing signal approximately ninety degrees out of phase with the first energizing signal.

23. The method of claim 20, wherein energizing the second pair of electrodes includes energizing the second pair of electrodes with a second energizing signal having a frequency that has a predetermined relationship with a frequency of the first energizing signal.

24. The method of claim 23, wherein energizing the second pair of electrodes includes energizing the second pair of electrodes with a second energizing signal having a frequency that is approximately equal to the frequency of the first energizing signal.

25. The method of claim 23, wherein energizing the second pair of electrodes includes energizing the second pair of electrodes with a second energizing signal having a frequency that is approximately an integer multiple to the frequency of the first energizing signal.

26. A method for generating an electromagnetic field within a processing chamber, comprising:

oppositely disposing a first pair of electrodes at opposite sides of the processing chamber;

oppositely disposing a second pair of electrodes at opposite sides of the processing chamber;

energizing the first pair of electrodes with a first energizing signal having a first amplitude; and energizing the second pair of electrodes with a second energizing signal having a second amplitude, wherein the first amplitude does not equal the second amplitude.

27. The method of claim 26, wherein oppositely disposing the first and second pairs of electrodes includes oppositely disposing the first and second pairs of electrodes such that the electrodes are approximately equally spaced about the processing chamber.

* * * * *

UNITED STATES PATENT AND TRADEMARK OFFICE
CERTIFICATE OF CORRECTION

PATENT NO. : 6,143,124
DATED : November 7, 2000
INVENTOR(S) : Ahn

It is certified that error appears in the above-identified patent and that said Letters Patent is hereby corrected as shown below:

COLUMN 1, LINE 18

Delete "electromagnetic: fields" and insert therefor: --electromagnetic fields--.

COLUMN 5, LINE 47

Delete "mutually--perpendicular" and substitute therefor: --mutually-perpendicular--.

COLUMN 6, LINE 65

Delete "ore" and substitute therefor: --one--.

COLUMN 7, LINE 54

Delete "arid" and substitute therefor: --and--.

Signed and Sealed this

Twenty-second Day of May, 2001

*Attest:*

NICHOLAS P. GODICI

*Attesting Officer*   *Acting Director of the United States Patent and Trademark Office*